(12) United States Patent
Feller

(10) Patent No.: US 7,860,190 B2
(45) Date of Patent: Dec. 28, 2010

(54) MULTI-CHANNEL TIMING RECOVERY SYSTEM

(75) Inventor: Marc Feller, Long Beach, CA (US)

(73) Assignee: Quantum Corporation, San Jose, CA (US)

( * ) Notice: Subject to any disclaimer, the term of this patent is extended or adjusted under 35 U.S.C. 154(b) by 943 days.

(21) Appl. No.: 11/688,092

(22) Filed: Mar. 19, 2007

(65) Prior Publication Data

US 2008/0232531 A1    Sep. 25, 2008

(51) Int. Cl.
*H04L 27/00* (2006.01)
(52) U.S. Cl. ..................................... 375/326
(58) Field of Classification Search .............. 375/376; 360/51
See application file for complete search history.

(56) References Cited

U.S. PATENT DOCUMENTS

| | | |
|---|---|---|
| 4,433,424 A | 2/1984 | Taber |
| 5,138,282 A | 8/1992 | Bailey |
| 5,206,769 A | 4/1993 | Bailey |
| 5,488,516 A * | 1/1996 | Kalfs et al. .............. 360/51 |
| 2004/0213337 A1* | 10/2004 | Li et al. ..................... 375/222 |

* cited by examiner

*Primary Examiner*—David C Payne
*Assistant Examiner*—Tanmay K Shah
(74) *Attorney, Agent, or Firm*—Baker Botts L.L.P.

(57) ABSTRACT

The present invention, in particular embodiments, is directed to methods, apparatuses and systems that provide global timing error information derived from timing error information of each data channel. This is achieved, in part, by summing the timing error information from all the data channels and integrating and scaling the resulting sum. The integrated, scaled sum is then added to the proportional and integral timing information of each individual data channel. By doing so, incorrect timing error estimates are averaged out. Additionally, when severe noise and dropouts (loss of data signal) at an individual data channel occur, that channel may rely on the global timing error information. In some implementations, that individual data channel's timing error information contribution can be excluded from the global timing error information.

18 Claims, 6 Drawing Sheets

MULTI-CHANNEL TIMING RECOVERY SYSTEM

TECHNICAL FIELD

The present disclosure generally relates to data channel timing recovery.

BACKGROUND

In a magnetic tape storage data channel it is desirable to recover regular clock timing information so that each bit can be detected and decoded properly.

One prior art approach for achieving this is to use a "common clock" which operates by generating a single clock which is distributed to all data channels. Each data channel then aligns the phase of the clock with the particular data stream that it is receiving. Typically, the clock needs to be running at a high multiple of the data rate so that an appropriate phase can be chosen by each data channel. However, since there are only certain phases available, some degree of fixed phase error will result.

Another prior art approach, used in analog clock recovery systems, utilizes a single, common capacitor which is AC coupled to each data channel's phase locked loop ("PLL") circuit. This capacitor receives the combined outputs of all PLL charge pumps so as to maintain a level reflective of an overall data frequency for all of the data channels. Short term data rates at individual data channels may occur, however, due to changes in an orientation of a moving tape relative to a read/write head, commonly referred to as "azimuth." Short term data rate variation at individual data channels is not addressed by the common capacitor approach.

SUMMARY

The present invention, in particular embodiments, is directed to methods, apparatuses and systems that provide global timing error information derived from timing error information of each data channel. This is achieved, in part, by summing the timing error information from all the data channels and integrating and scaling the resulting sum. The integrated, scaled sum is then added to the proportional and integral timing information of each individual data channel. By doing so, incorrect timing error estimates are averaged out. Additionally, when severe noise and dropouts (loss of data signal) at an individual data channel occur, that channel may rely on the global timing error information. In some implementations, that individual data channel's timing error information contribution can be excluded from the global timing error information.

The following embodiments and aspects thereof are described and illustrated in conjunction with systems, apparatuses and methods which are meant to be exemplary and illustrative, not limiting in scope. In various embodiments, one or more of the above-described problems have been reduced or eliminated. In addition to the aspects and embodiments described above, further aspects and embodiments will become apparent by reference to the drawings and by study of the following descriptions.

BRIEF DESCRIPTION OF THE DRAWINGS

Example embodiments are illustrated in referenced figures of the drawings. It is intended that the embodiments and figures disclosed herein are to be considered illustrative rather than limiting.

DETAILED DESCRIPTION

The following embodiments and aspects thereof are described and illustrated in conjunction with systems, apparatuses and methods which are meant to be illustrative, not limiting in scope.

Aspects of the claimed embodiments are directed to a multi-channel timing recovery system for use in a magnetic storage device. Each data channel includes a timing recovery circuit that generates its own clock and determines a phase relationship between that clock and the data channel input data stream. The phase relationship is utilized, in part, to adjust a numerically-controlled oscillator ("NCO") to drive phase error to zero. Additionally, the timing recovery circuit calculates a time integral of the phase error to provide a first frequency reference which is also referred to as filtered phase error. Phase errors of all of the timing recovery circuits are also provided to a global rate integrator to generate a second frequency reference, also referred to as global phase error, which is fed back to NCOs of each timing recovery circuit.

Particular implementations of the invention also envision amplitude detectors at each timing recovery circuit to detect dropouts and thermal asperity events. A dropout is a region of reduced amplitude resulting in loss of signal. A thermal asperity event occurs when an agglomeration of particulate matter on the tape strikes the head thus causing a voltage spike. When such events occur, the affected data channel phase error contribution to a corresponding NCO is removed. Due to this, the NCO operates only using the second frequency reference, which the global integrator generates, until the event subsides. Advantageously, this prevents false phase and frequency information from adversely affecting the NCO. In one implementation, the affected data channel's phase error contribution to the global rate integrator is additionally cutoff when a dropout or thermal asperity event occurs. In another implementation, the affected timing recovery circuit's phase error contribution to the global rate integrator is cutoff when a dropout or thermal asperity event occurs and the contribution (gain) of the second frequency reference is increased by a pre-determined amount to compensate for the cutoff contribution of the affected timing recovery circuit.

Figure 1A:
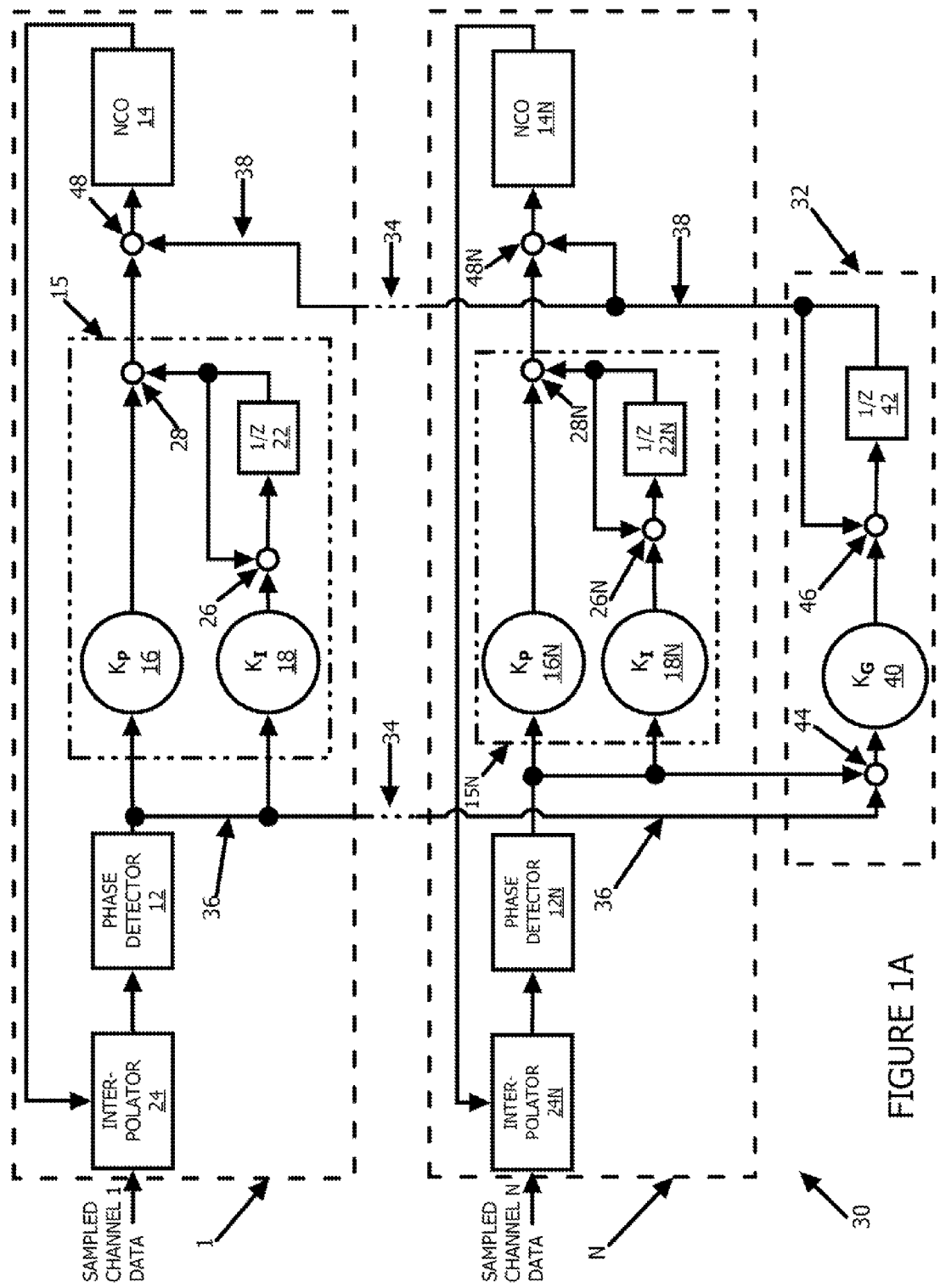
FIGS. 1A-1B are block diagrams illustrating a multi-channel timing recovery system, in accordance with an example embodiment.

FIG. 1A is a block diagram illustrating a multi-channel timing recovery system 30, in accordance with an example embodiment. System 30 can include multiple timing recovery circuits beginning with timing recovery circuit 1 through timing recovery circuit N wherein N equals a number of timing recovery circuits in system 30. In tape drives generally, there is one timing recovery circuit for each track. Accordingly, N could be 8, 16 or any desired number. Dashed portions 34 of signal connections 36 and 38 are meant to convey a potential existence of one or more additional timing recovery circuits between circuits 1 and N. Each circuit (1,N)

corresponds to a data channel. System 30 also includes a global phase integrator 32 which will be discussed in a subsequent section.

The circuits (1,N) compare a phase of a data stream to a clock phase and make adjustments to the phase of the clock to drive any difference to zero. Each timing recovery circuit includes a phase error detector (12, 12N), an NCO (14, 14N), a loop filter (15, 15N) comprising a phase gain Kp element (16, 16N), an integrator gain Ki element (18, 18N), adders (26, 26N, 28, 28N) and a phase error integrator (22, 22N) which is typically labeled as "z$^{-1}$" or "1/z." Also included is a digital interpolator (24, 24N).

The input to the digital interpolator (24, 24N) is a data stream of digital values, typically 1-byte words, representative of an amplitude of an input data signal at a given sampling rate (typically higher than the data rate based on Nyquist limits). The digital interpolator (24, 24N) provides an interpolated input signal value at a specific offset value within the current cell or sample bin provided by the NCO (14, 14N). For example, digital interpolator (24, 24N) may perform interpolation on a sequence of input data samples to provide an interpolated value corresponding to the offset value within the current cell. In one implementation, the digital interpolators use cubic interpolation to provide an interpolated value based on sampled values in a sequence. The digital interpolator (24, 24N) will then examine a series of successive digital values about the offset and interpolate the desired value based on the examination. In turn, the phase error detector (12, 12N) examines the interpolated value to determine a phase error value based on a difference between the interpolated value and what the interpolated value ought to be. With PR4 signals, phase error detector (12, 12N) can use decision-directed phase error detection algorithms, such as the Mueller-Müller algorithm. The output of the digital interpolator (24, 24N) can also be provided to one or more logic circuits that decode the bit stream.

The phase error value then passes through the loop filter (15, 15N) via phase gain Kp element (16, 16N) that takes a percentage of the phase signal and the integrator gain Ki element (18, 18N) that also takes a percentage of the phase error value. The Ki percentage of the phase error value is summed with a value of phase error integrator (22, 22N) output via adder (26, 26N). The phase error integrator (22, 22N) then integrates the summed phase error value and adder (28, 28N) sums the integrated phase error with the output of phase gain Kp element (16, 16N) to generate a filtered phase error value. Adder (48, 48N) sums the filtered phase error value and a global phase error value, generated by the global phase integrator 32, and the resulting phase error sum is the input to the NCO (14, 14N).

An accumulator of the NCO (14, 14N) accumulates filtered phase error values with each clock cycle. A current value in the accumulator of the NCO (14, 14N) is how far (the offset value) into the current cell that the NCO (14, 14N) signals the digital interpolator (24, 24N) to take a measurement. An upper limit of the accumulator of the NCO (14, 14N) is 1.0 which corresponds to a normalized bit cell width. When the upper limit is reached, the excess over the upper limit remains in the accumulator of the NCO (14, 14N). For example, if the current value in the accumulator of the NCO (14, 14N) is 0.8 and a new filtered phase error value is 0.4, then the upper limit will be reached as 0.8+0.4=1.2 resulting in an excess of 0.2 which remains in the accumulator of the NCO (14, 14N).

The digital interpolator (24, 24N) can be implemented in various ways. The loop filters (15, 15N) of the circuits (1, N) are used, in part, to condition and smooth out higher frequency components of the phase error signal. Doing so prevents the NCO (14, 14N) from signaling for an interpolation too early in a clock cycle. The loop filters of the circuits (1, N) can be any suitable loop filter. An example of a suitable loop filter is an alpha-beta filter; other suitable loop filters include Kalman-type filters.

In one implementation, the loop filter (15, 15N) comprises a phase component and a rate component. In other words, the loop filters (15, 15N) of the circuits (1, N) provide a filtered phase error value that has two components—a local phase error component and a local bit rate component. The phase gain Kp element (16, 16N) and the integrator gain Ki element (18, 18N), in one implementation, are both fixed (but tunable) values. The value of the output of the phase error integrator (22, 22N) is representative of an average bit rate at the data channel which in turn is representative of average tape speed at a track of the tape corresponding to the data channel. Since the bit rate may change, the value of the output of the phase error integrator (22, 22N) can therefore also change. The value of the output of the phase error integrator (22, 22N) also influences how fast the NCO (14, 14N) will operate. If the bit rate increases, the value of the output of the integrated phase error (22, 22N) will increase due to increasing phase error. The increase in the value of the output of the phase error integrator (22, 22N) in turn increases the filtered phase error value thus causing the NCO (14, 14N) to reach its upper limit sooner. The opposite occurs when the bit rate decreases.

As previously mentioned, global rate integrator 32 provides the global phase error value to NCOs (14, 14N) of the circuits (1, N). The global phase error value is developed from phase error values of each circuit (1, N) and is indicative of an average bit rate of all the circuits (1, N). The global phase error value is developed by adder 44 summing the phase error values from each circuit (1, N), global integrator gain KG 40 takes a percent of the summed phase error values and adder 46 sums the output of the gained sum with a value of a global gain integrator 42. Global gain integrator 42 then integrates the sum from adder 46 to obtain the global phase error value and adders (48, 48N) sum the global phase error value with respective local filtered phase error values from the circuits (1, N), the resulting sums being the input of the respective NCOs (14, 14N).

The value of the global integrator gain KG 40, in one implementation, is a fixed value. The gain values Kp, Ki, and Kg can be selected to optimize system stability and performance based on a variety of engineering considerations (e.g., tape speed, dynamic azimuth range, etc.) to adjust the relative influence that each component has on the phase error values provided to the NCOs (14, 14N).

Figure 1B:
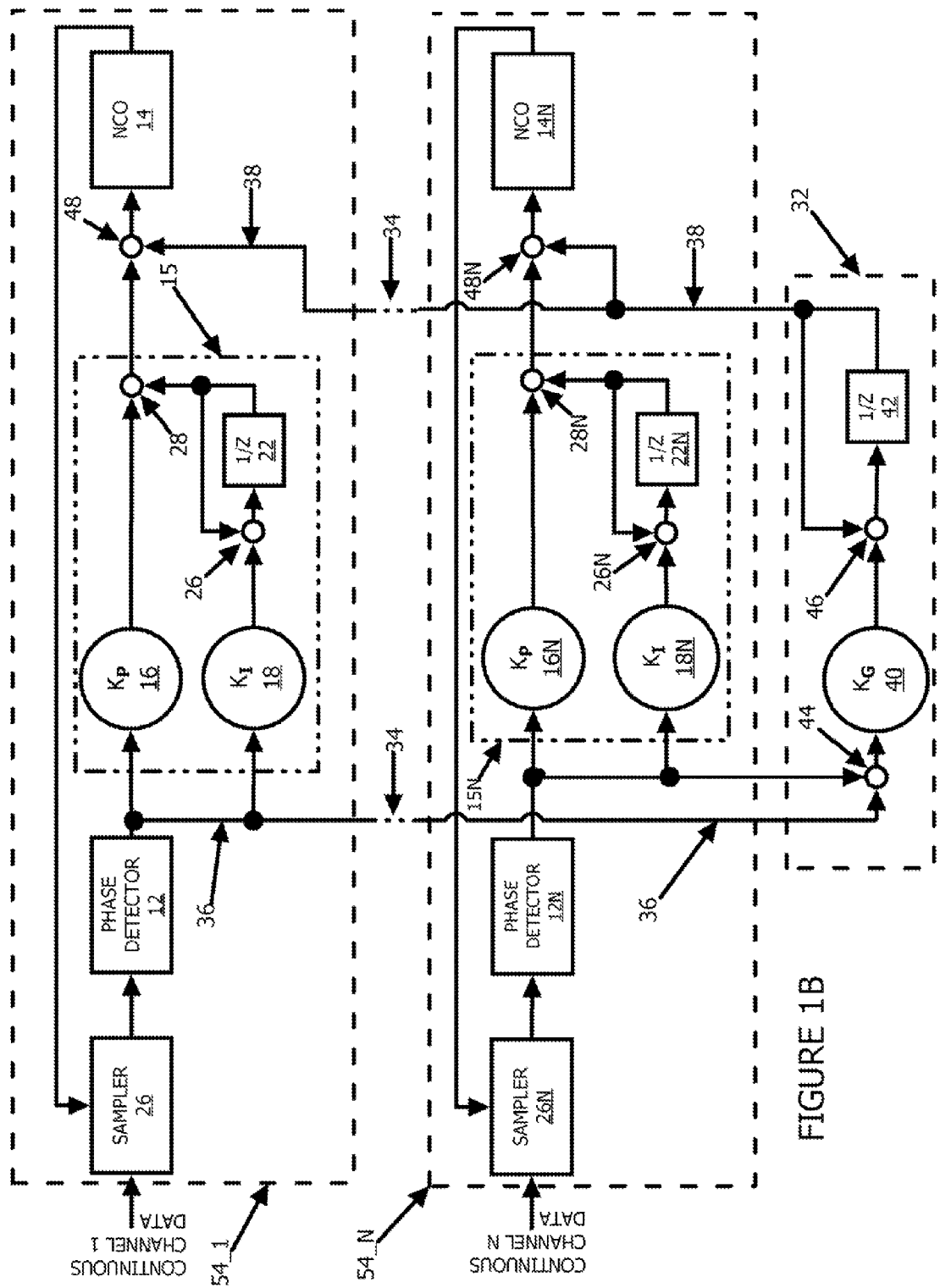

Referring to FIG. 1B, circuits 54_1 and 54_N do not utilize digital interpolators (24, 24N) and instead uses samplers (26, 26N) as their input data streams are continuous. Due to this the samplers (26, 26N) sample the input data streams at offsets determined by the NCOs (14, 14N) to directly obtain a digital value. Other portions of circuits 54_1 and 54_N function the same way as equivalent portions of circuits 1 or N.

The remainder of the claimed embodiments will be presented utilizing circuits similar to circuits 1 and N of FIG. 1A. It should be understood that all of the claimed embodiments can be implemented using circuits such as 54_1 and 54_N of FIG. 1B when input data streams are continuous.

Additionally, the balance of the figures does not always single out timing recovery circuits and the global rate integrator so as to not unnecessarily obscure the claimed embodiments. For similar purposes, the various loop filters are also not labeled in the rest of the figures.

On occasion, due to an increase in head-to-tape spacing or a region of inadequate coating thickness, the playback signal will fade for a period of time. This is called a "dropout" (DO). Moreover, an agglomeration of particulate matter on the tape may sometimes strike the head, causing it to emit a voltage spike called a thermal asperity (TA). Either will hereafter be referred to an "event," and either can have the effect of disturbing the timing recovery circuit with possible loss of phase lock. Therefore when an event occurs, it is desirable to remove affected data channel's stream of filtered phase error value contributions to their respective NCOs and instead utilize the global gain integrator's stream of global phase error values until the event subsides.

Figure 2:
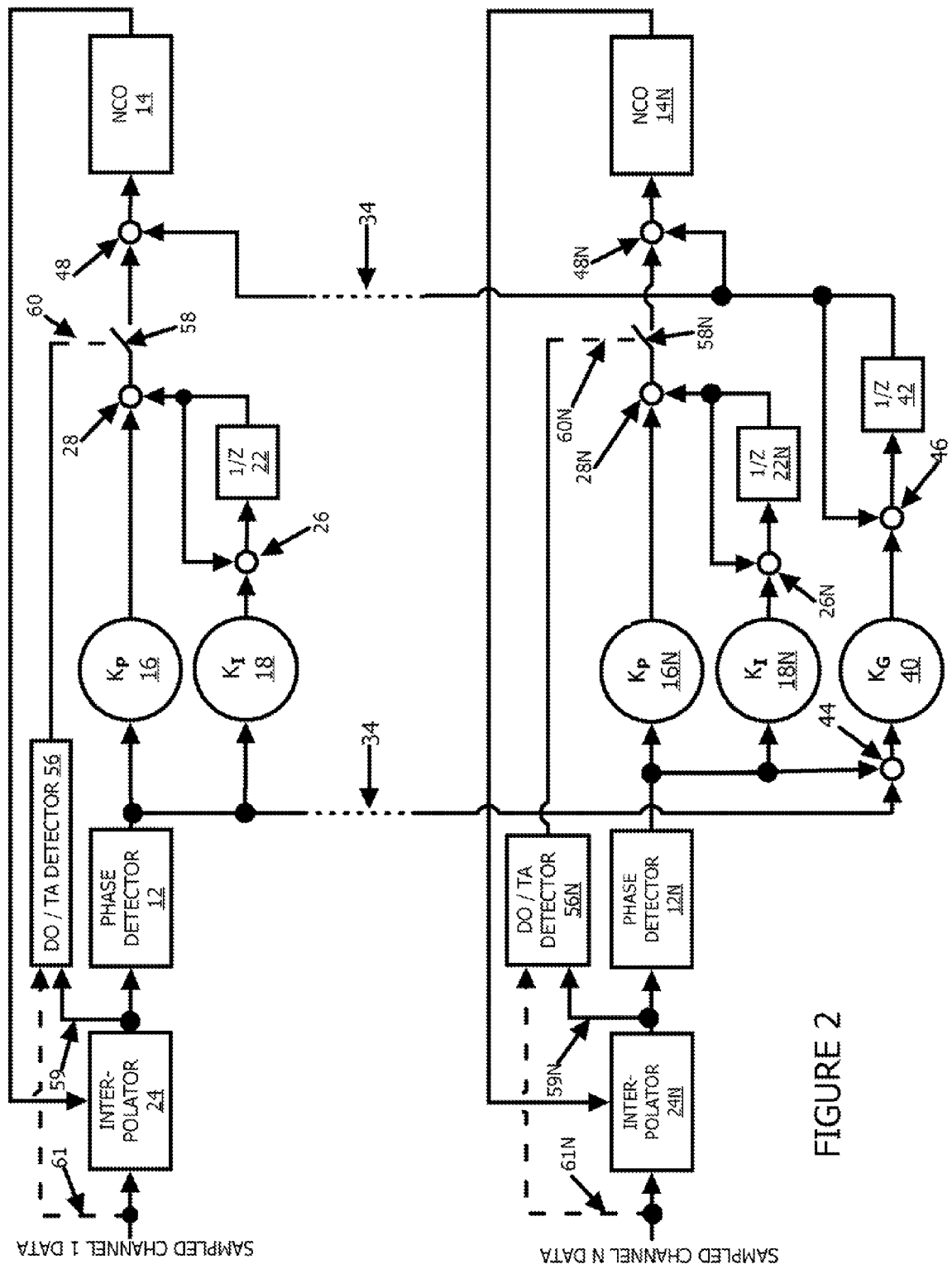
FIG. 2 is a block diagram illustrating another multi-channel timing recovery system, in accordance with an example embodiment.

Referring to FIG. 2, FIG. 2 includes DO/TA detectors (56, 56N) at each timing recovery circuit. Since an event can be detected at various locations, inputs to the detectors (56, 56N) can be placed before or after the digital interpolators (24, 24N), as indicated by connections 59, 59N, 61, 61N or perhaps at other locations preceding the digital interpolators (24, 24N). When an event occurs, the DO/TA detector (56, 56N) detects it and opens a switch (58, 58N) located just before the adder (48, 48N) to cutoff the timing recovery circuits filtered phase error value contribution to the NCO (14, 14N) for the duration of the event. When the event subsides, the detector (56, 56N) closes the switch (58, 58N) thus allowing the timing recovery circuit to contribute filtered phase error values to the NCO (14, 14N). In the depiction of FIG. 2, the switches (58, 58N) are shown in an open position. Additionally, dashed portions (60, 60N) indicate that the detector (56, 56N) controls the switch (58, 58N).

In the preceding description of FIG. 2 and for subsequent figures, detection of an event and opening of closing of switches is sometimes described referencing detectors and switches of both of the displayed timing recovery circuits. It should be understood that the description is not meant to imply that if an event is detected at one circuit that switches at the other circuit will be opened or closed due that detection.

Figure 3:
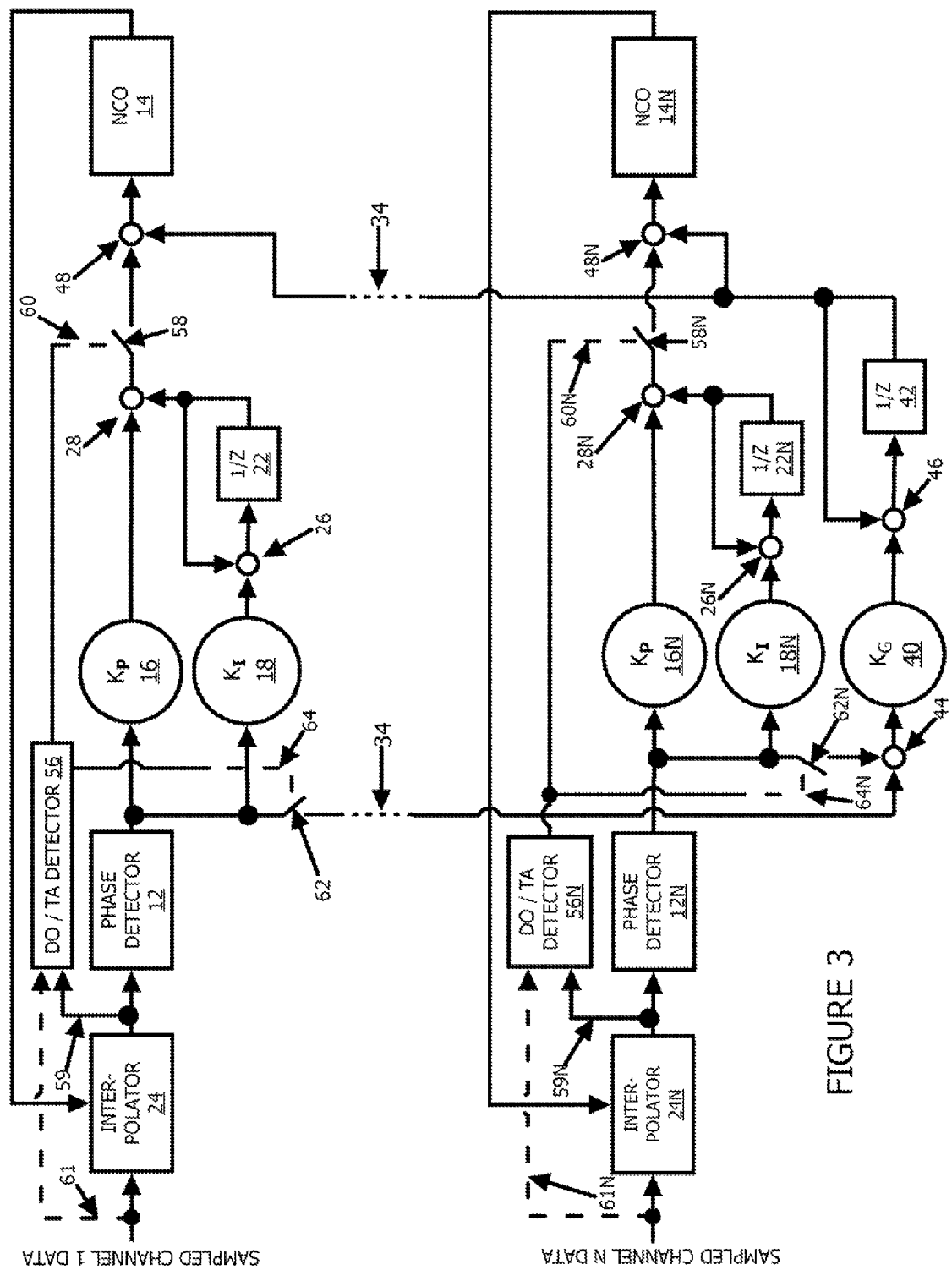
FIG. 3 is a block diagram illustrating yet another multi-channel timing recovery system, in accordance with an example embodiment.

When an event occurs, it may be desirable to remove a data channel's contribution to the global phase integrator as shown in FIG. 3. In addition to switches 60 and 60N, FIG. 3 further includes switches 62 and 62N situated to cutoff phase error values, from the phase detectors (12, 12N), to adder 44. When the detector (56, 56N) detects an event, the detector (56, 56N) opens both switches (58, 62, 58N, 62N). When the event subsides, the detector (56, 56N) closes the switches (58, 62, 58N, 62N) thus reconnecting the affected circuit to its NCO (14, 14N) and adder 44. Similar to FIG. 2, dashed portions (64, 64N) indicate that the detector (56, 56N) controls the switch (62, 62N).

Figure 4A:
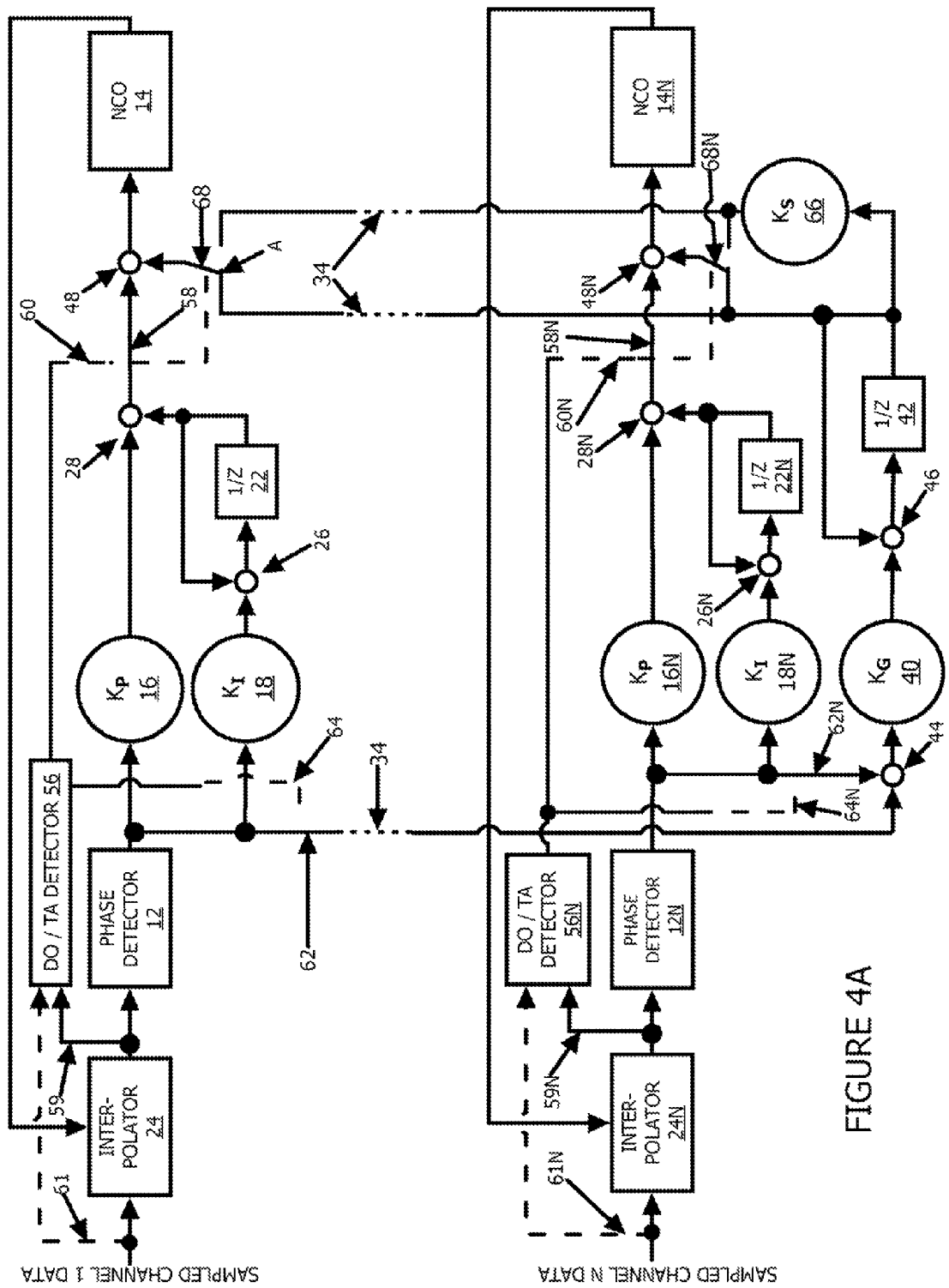
FIGS. 4A-4B are block diagrams illustrating an additional multi-channel timing recovery system, in accordance with an example embodiment.
Figure 4B:
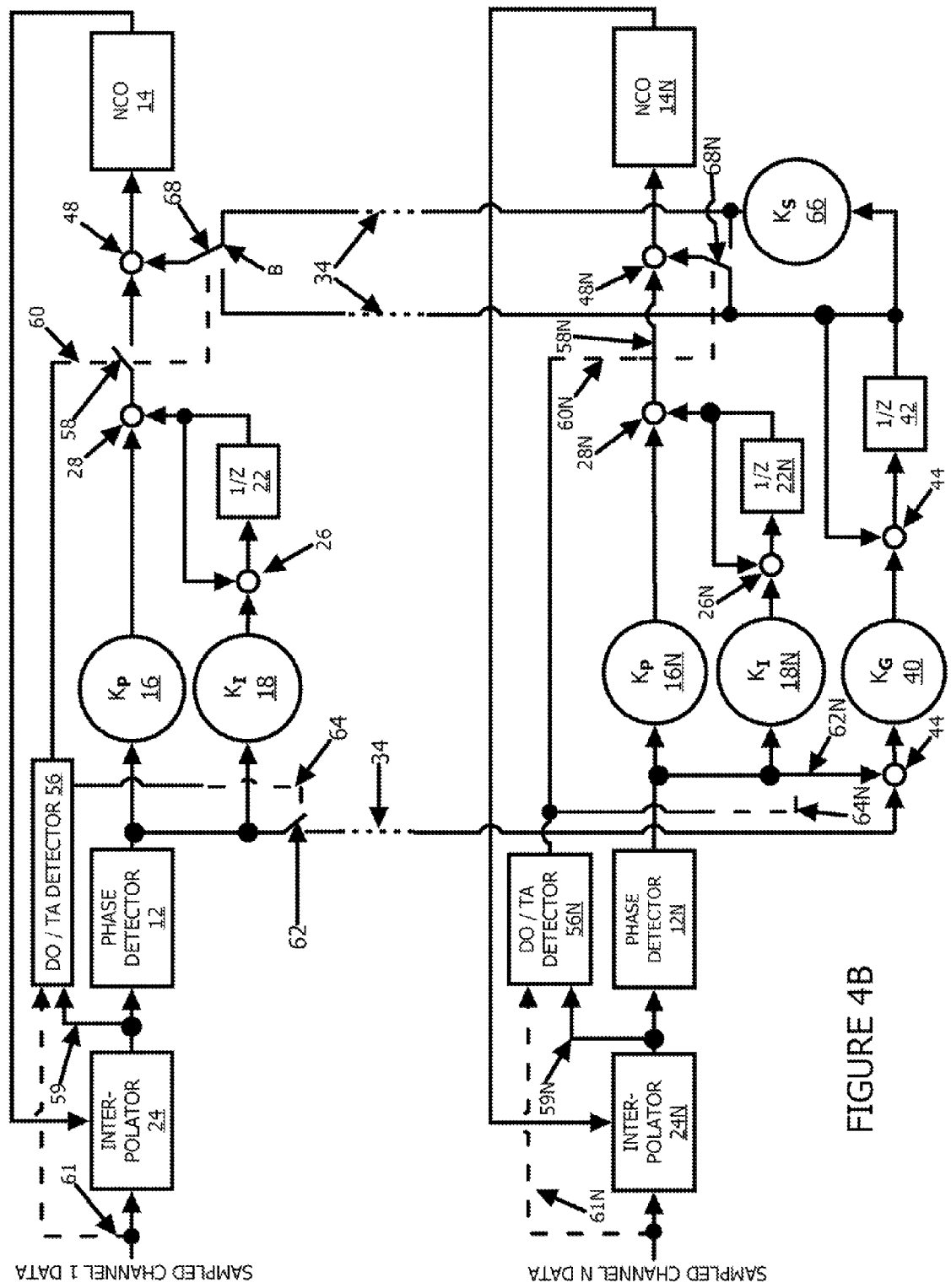

In the embodiment of FIG. 3, a circuit's integrated phase error contribution to adder 44 is removed when an event occurs. In FIGS. 4A-4B, a substitute gain Ks 66 is additionally utilized when an event occurs at a timing recovery circuit to increase the amount of contribution from the global integrator gain Kg 42. In one implementation, this ensures continuous system stability by maintaining the total phase error gain contribution to adder 44 the same whether or not an event occurs. In one implementation, the product of the values of the global integrator gain Kg 42 and the substitute gain Ks 66 is equal to the sum of the global integrator gain Kg 42 and the integrator gain Ki (18, 18N). Therefore the substitute gain is set to Ks=(Ki+Kg)/Kg.

To accommodate for the potential reduction in the global phase error value when an event occurs, the substitute gain Ks 66 and switch (68, 68N) are utilized in FIGS. 4A and 4B. When an event is detected at detector 56, for example, detector 56 moves switch 68 from position A, as shown in FIG. 4A, to position B, as shown in FIG. 4B. Additionally, switch 62 is moved from a closed position in FIG. 4A to an open position in FIG. 4B. During the duration of the event, the affected circuit is cutoff from feeding filtered phase error values to the NCO 14 and also cutoff from feeding phase error values to adder 44. Also, for the duration of the event, substitute gain $K_S$ 66 boosts global phase error values that are sent to the NCO 14. Dashed portions (60, 60N) indicate that the detector (56, 56N) controls the switches (58, 58N, 68, 68N).

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A multi-channel timing recovery system for use in a magnetic storage device comprising:
    two or more data channel timing recovery circuits each comprising:
        a digital interpolator operative to:
            receive offset values and a digitized input stream comprising a series of digital values corresponding to an amplitude of an input data signal sampled at a sampling rate; and
            provide interpolated values based on the digitized input stream and the offset values;
        a phase error detector, coupled to the digital interpolator, operative to determine phase error based on the interpolated values, the determined phase error comprising a stream of local phase error values;
        a loop filter, coupled to the phase error detector operative to filter the stream of local phase error values and provide a stream of filtered local phase error values, wherein the filtered local phase error values comprise an aggregate of a local phase error component and a local bit rate component;
        a numerically-controlled oscillator operative to provide the offset values responsive to an input stream of phase error values;
        a global rate integrator operative to integrate a sum of the respective streams of local phase error values from the phase error detectors of the two or more data channel timing recovery circuits to provide a stream of global phase error values, the stream of global phase error values characterizing an average observed bit rate;
        a first switch disposed between the loop filter and the numerically-controlled oscillator; and
        an event detector coupled to an output of the digital interpolator and operative to:
            detect an event; and
            open the first switch when the event is detected;
    wherein the input stream of phase error values provided to each of the numerically-controlled oscillators comprises a sum of the respective filtered local phase error values and the global phase error values.

2. The multi-channel recovery system as recited in claim 1 wherein the two or more data channel timing recovery circuits each further comprise a second switch disposed between the phase detector and the global rate integrator and wherein the event detector is further operative to open the second switch when the event is detected.

3. The multi-channel recovery system as recited in claim 2 wherein the global rate integrator is further operative to provide a stream of gained global phase error values.

4. The multi-channel recovery system as recited in claim 3 wherein the two or more data channel timing recovery circuits each further comprise a third switch disposed between the input stream of phase error values and the global rate integrator and wherein the event detector is further operative to move the switch from the stream of global phase error values to the stream of gained global phase error values when an event is detected thereby changing the input stream of phase error values provided to the numerically-controlled oscillator to be only the stream of gained global phase error values.

5. The multi-channel recovery system as recited in claim 4 wherein the event detector closes the first and switches and moves the third switch back to the stream of global phase error values when the event subsides.

6. The multi-channel recovery system as recited in claim 5 wherein the event detector is coupled to the digitized input stream.

7. The multi-channel recovery system as recited in claim 6 wherein the event is a thermal asperity event.

8. The multi-channel recovery system as recited in claim 6 wherein the event is a dropout.

9. In a multi data channel system, a method for timing recovery in a data channel, the method comprising:
   receiving an offset value for sampling a digitized input stream;
   providing interpolated values based on the offset value and the digitized stream;
   determining a phase error based on the interpolated values wherein the phase error comprises a stream of local phase error values;
   filtering the stream of local phase error values;
   providing a stream of filtered local phase error values which comprise an aggregate of a local phase error component and a local bit rate component;
   receiving a stream of global phase error values characterizing an average observed bit rate of the system;
   generating a new offset value based on the phase error wherein the phase error comprises a sum of local filtered phase error values and global phase error values; and
   selectively removing the local filtered phase error contribution to the phase error.

10. The method as recited in claim 9 wherein removing the local filtered phase error contribution to the phase error is based on detection of an event.

11. The method as recited in claim 10 wherein the event is a thermal asperity event.

12. The method as recited in claim 10 wherein the event is a dropout.

13. A multi-channel recovery system for use in a magnetic storage device comprising:
   two or more data channels;
   for each data channel:
      a numerically-controlled oscillator receptive to first and second control signals;
      a digital interpolator receptive to a byte stream at a sample rate and the numerically-controlled oscillator;
      a phase detector receptive to the digital interpolator and operative to develop a local phase error signal;
      a loop filter receptive to the local phase error signal and operative to develop the first control signal;
      a global rate integrator receptive to two or more local phase error signals and operative to develop the second control signal;
      a first switch disposed between the loop filter and the numerically-controlled oscillator; and
      an event detector coupled to an output of the digital interpolator and operative to:
         detect an event; and
         open the first switch when the event is detected;
      wherein the first control signal has a local phase error component and a local rate component; and
      wherein the second control signal characterizes an average rate of the data channels utilized to develop the second control signal.

14. The multi-channel recovery system as recited in claim 13 wherein the two or more data channel timing recovery circuits each further comprise a second switch disposed between the phase detector and the global rate integrator and wherein the event detector is further operative to open the second switch when the event is detected.

15. The multi-channel recovery system as recited in claim 14 wherein the global rate integrator is further operative to provide a stream of gained global phase error values.

16. The multi-channel recovery system as recited in claim 15 wherein the two or more data channel timing recovery circuits each further comprise a third switch disposed between the input stream of phase error values and the global rate integrator and wherein the event detector is further operative to move the switch from the stream of global phase error values to the stream of gained global phase error values when an event is detected thereby changing the input stream of phase error values provided to the numerically-controlled oscillator to be only the stream of gained global phase error values.

17. The multi-channel recovery system as recited in claim 16 wherein the event detector closes the first and switches and moves the third switch back to the stream of global phase error values when the event subsides.

18. A multi-channel timing recovery system for use in a magnetic storage device comprising:
   two or more data channel timing recovery circuits each comprising:
      a sampler operative to:
         receive offset values and an input data signal;
         provide values of the input data signal based on the offset value;
      a phase error detector, coupled to the sampler, operative to determine phase error based on the values, the determined phase error comprising a stream of local phase error values;
      a loop filter, coupled to the phase error detector, operative to filter the stream of local phase error values and provide a stream of filtered local phase error values, wherein the filtered local phase error values comprise an aggregate of a local phase error component and a local bit rate component;
      a numerically-controlled oscillator operative to provide the offset values responsive to an input stream of phase error values;
      a global rate integrator operative to:
         integrate a sum of the respective streams of local phase error values from the phase error detectors of the two or more data channel timing recovery circuits to provide a stream of global phase error values, the stream of global phase error values characterizing an average observed bit rate;
      a first switch disposed between the loop filter and the numerically-controlled oscillator; and
      an event detector coupled to an output of the sampler and operative to:
         detect an event; and
         open the first switch when the event is detected;
   wherein the input stream of phase error values provided to each of the numerically-controlled oscillators comprises a sum of the respective filtered local phase error values and the global phase error value.

* * * * *